United States Patent [19]

Ayabe et al.

[11] Patent Number: 4,736,231

[45] Date of Patent: Apr. 5, 1988

[54] SEMICONDUCTOR LASER DEVICE HAVING A SEMICONDUCTOR SUBSTRATE, A LASER CHIP THEREON AND SPACED PHOTO-DETECTING PORTIONS

[75] Inventors: Masaaki Ayabe; Sumio Santa; Osamu Matsuda, all of Kanagawa, Japan

[73] Assignee: Sony Corporation, Tokyo, Japan

[21] Appl. No.: 788,146

[22] Filed: Oct. 16, 1985

[30] Foreign Application Priority Data

Oct. 16, 1984 [JP] Japan ................. 59-216790

[51] Int. Cl.$^4$ ............................................. H01L 31/12
[52] U.S. Cl. .................................... 357/19; 357/30; 372/50
[58] Field of Search ............... 372/50, 44, 29, 36, 372/33; 357/17, 19, 30 D; 250/211 J

[56] References Cited

U.S. PATENT DOCUMENTS

| 4,366,377 | 12/1982 | Notthoff et al. | 357/30 D |
| 4,450,565 | 5/1984 | Copeland | 372/44 |
| 4,604,753 | 8/1986 | Sawai | 372/36 |

Primary Examiner—James W. Davie
Attorney, Agent, or Firm—Hill, Van Santen, Steadman & Simpson

[57] ABSTRACT

A semiconductor laser device is disclosed herein in which a semiconductor laser chip is mounted on a surface of a semiconductor substrate at one region and a plurality of photo-detecting portions for receiving laser light emitted from the semiconductor laser chip are provided on the surface of the semiconductor substrate at another region separated from the semiconductor laser chip.

12 Claims, 4 Drawing Sheets

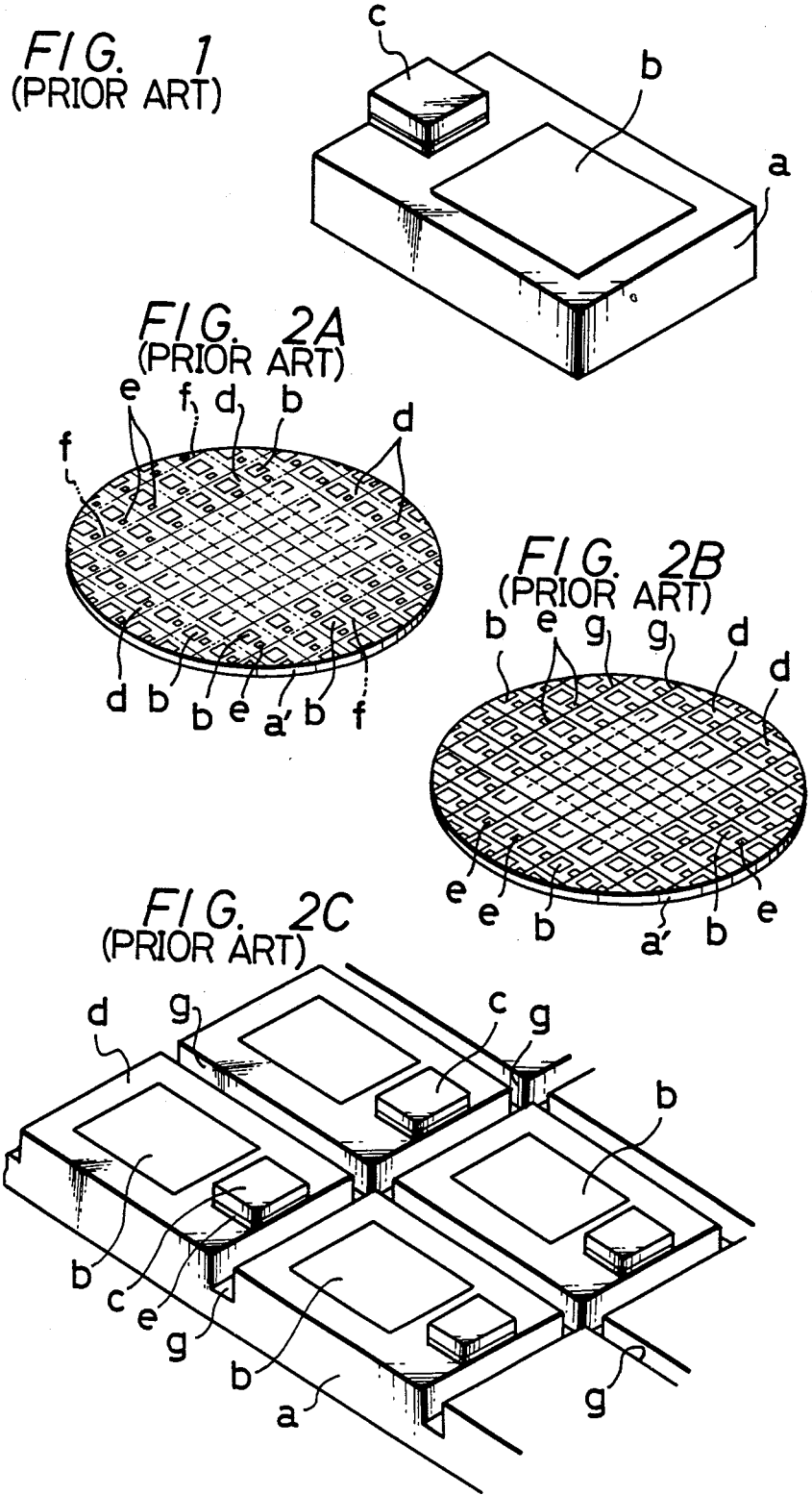

SEMICONDUCTOR LASER DEVICE HAVING A SEMICONDUCTOR SUBSTRATE, A LASER CHIP THEREON AND SPACED PHOTO-DETECTING PORTIONS

BACKGROUND OF THE INVENTION

1. Field of the Invention

The present invention generally relates to semiconductor laser devices and, more particularly, is directed to a semiconductor laser device in which a semiconductor laser chip is mounted on a semiconductor substrate at one region and a plurality of photo-detecting portions for detecting laser light are formed on the surface of the semiconductor substrate at another region separated from the semiconductor laser chip, where the chip is not mounted. In this application, the direction of the laser light emitted from the semiconductor laser chip and whether or not the luminous intensity distribution of the laser light beam in the plane direction (that is, the surface of the substrate) has a symmetrical property can be measured easily and accurately.

2. Description of the Prior Art

A prior art semiconductor laser device is shown in FIG. 1 in which a monitor photodiode b is formed on a surface of a semiconductor substrate (for example, N+type) a and a semiconductor laser chip c is formed on a portion of the semiconductor substrate a near the photodiode b. A manufacturing method for producing a semiconductor laser device, as used by the applicant is shown in FIG. 2. First, as shown in FIG. 2A, a semiconductor wafer a' is treated so as to form a photodiode. A photodiode b is formed on a part of each of the element forming regions d, and a solder layer e for use in laser chip connection is formed on another portion thereof. In FIG. 2A, lines such as f partition or separate adjacent element forming regions such as d, and the element forming regions d are to be diced or separated along lines f. Then, as shown in FIG. 2B, the surface of the semiconductor wafer a' is half-diced or cut along the lines f, thereby forming grooves such as g. Thereafter, as shown in FIG. 2C, a semiconductor laser chip c is positioned on the solder layer e in each of the element forming regions d. The semiconductor wafer a' is then heated in a furnace to about 250° C. to bond all of the semiconductor laser chips c simultaneously. After the electrical characteristic and the optical characteristic are measured, inspected, screened, or the like, the semiconductor wafer a' is separated along grooves g, as shown in FIG. 2D, thereby separating the element forming regions into discrete elements or devices. Thereafter, as shown in FIG. 2E, the element is bonded to a heat sink i which is formed on a surface of a stem, not shown. Next, leads j and j' are attached to the stem, and the semiconductor laser chip c and the electrode of the photodiode b are bonded by wire k to one another, thus practically mounting the semiconductor laser device.

By this prior art manufacturing method, the semiconductor laser chip is connected to the semiconductor substrate in the wafer state rather than in the element or device state. This has the advantage that the semiconductor laser chips can be bonded simultaneously on a vast number of element forming regions on one semiconductor wafer. In addition, where the semiconductor substrate is still in the wafer state, an electrical characteristic such as a threshold current (Ith) etc., can be measured by using a probe or screening therefor can be carried out. Thus, the costs for the bonding of the semiconductor laser device can be decreased as well as the costs for inspection and screening. The previously-described method is highly advantageous from these standpoints.

However, in the prior art, when the semiconductor substrate a is in the wafer state, it is impossible to measure and inspect the direction in which the laser light is emitted from the semiconductor laser chip c and the symmetrical properties of a far field pattern thereof. The displacement of the laser light in the emission direction and the asymmetrical property of its far field pattern are changed relatively easily by the change in position of the semiconductor laser chip c relative to the semiconductor substrate a in the $\theta$ direction (i.e., the angular displacement of the semiconductor laser chip c). If such positional displacement exceeds a predetermined tolerance, the semiconductor laser device must be regarded as unsatisfactory and removed from the manufacturing process as soon as possible. Unlike the threshold current (Ith) and the like, the emission direction of the laser light and the symmetrical property of its far field pattern cannot be measured and inspected by any method other than a method in which the semiconductor laser device is practically mounted on a container, the laser light is emitted from the semiconductor laser chip and the laser light emitted outside the container is detected by a photosensor. Thus before the semiconductor laser device is practically mounted, the semiconductor laser device in which the symmetrical property of the far field pattern exceeds tolerances cannot be removed from the manufacturing process. With respect to such an unsatisfactory semiconductor laser device, the element or device bonding and the wire bonding to the heat sink i are needlessly carried out. This increases the manufacturing cost of the semiconductor laser device and renders it difficult to decrease the manufacturing cost of the semiconductor laser device.

SUMMARY OF THE INVENTION

Accordingly, it is an object of this invention to provide a semiconductor laser device in which a semiconductor laser chip is precisely positioned and bonded on a semiconductor substrate, in which it can easily be determined whether or not the far field pattern has a symmetrical property and where these properties can be easily measured at the stage in which the semiconductor laser device is not yet mounted on a heat sink, header or the like.

It is another object of this invention to provide a semiconductor laser device in which a plurality of photo-detecting portions for receiving laser light emitted from a semiconductor laser chip are formed on a surface portion of the semiconductor substrate.

It is a further object of this invention to provide a semiconductor laser device in which an unsatisfactory product can be easily removed at a stage before the semiconductor laser device is practically mounted so as to avoid the device bonding, the wire bonding and the like.

According to the present invention, a drive current is applied to a semiconductor laser chip by a probe or the like to cause the semiconductor laser chip to emit laser light. A reverse bias voltage is applied to each photo-detecting portion formed on the surface of the semiconductor substrate by using a probe or the like to detect the current flowing through the photo-detecting portion. Then, by calculating the ratio of photocurrents flowing through the respective photo-detecting portions, it is possible to easily measure and inspect the symmetrical property of a far field pattern and the positioning of the semiconductor laser chip in the vertical direction or the like. Thus, even in the stage at which the semiconductor laser device is not practically mounted, the symmetrical property of the far field pattern or the like can be inspected and an unsatisfactory semiconductor laser device can be removed from the manufacturing process even at that stage.

According to one aspect of the present invention, there is provided a semiconductor laser device comprising: a semiconductor substrate; a semiconductor laser chip mounted on said semiconductor substrate at one region; and a plurality of photo-detecting portions for receiving laser light emitted from said semiconductor laser chip provided on said semiconductor substrate at another region separated from said semiconductor laser chip.

These and other objects, features and advantages of the semiconductor laser device according to the present invention will become apparent from the following detailed description of the preferred embodiments taken in conjunction with the accompanying drawings. Throughout the application like reference numerals designate like elements and parts

BRIEF DESCRIPTION OF THE DRAWINGS

FIG. 1 is a perspective view showing an example of a prior art semiconductor laser device;

FIGS. 2A to 2E are perspective views showing a prior art method of manufacturing a semiconductor laser device in accordance with the sequence of the manufacturing processes;

DESCRIPTION OF THE PREFERRED EMBODIMENT

Figure 2D:
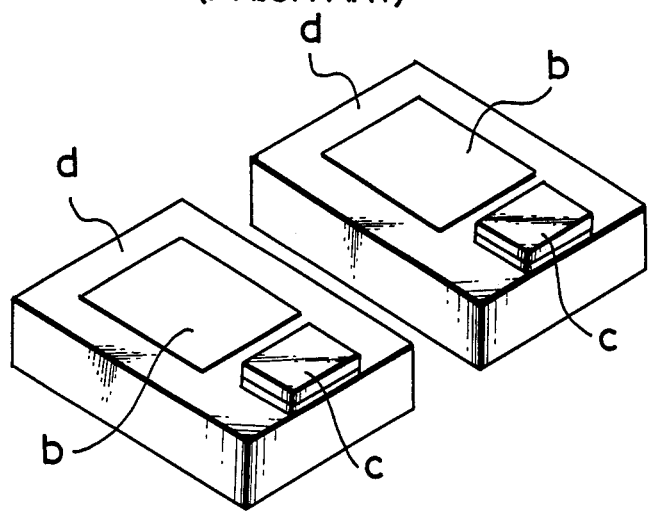
Figure 2E:
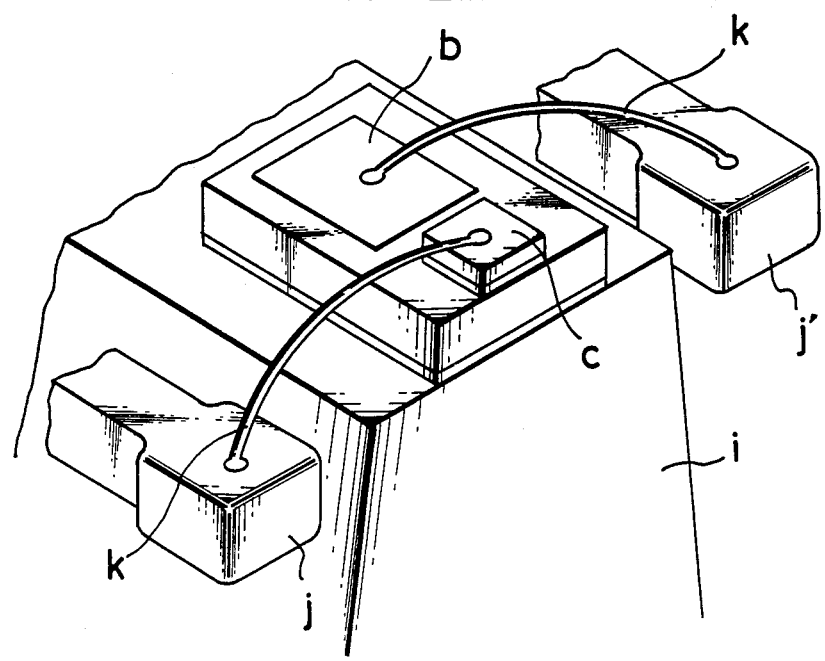
Figure 3:
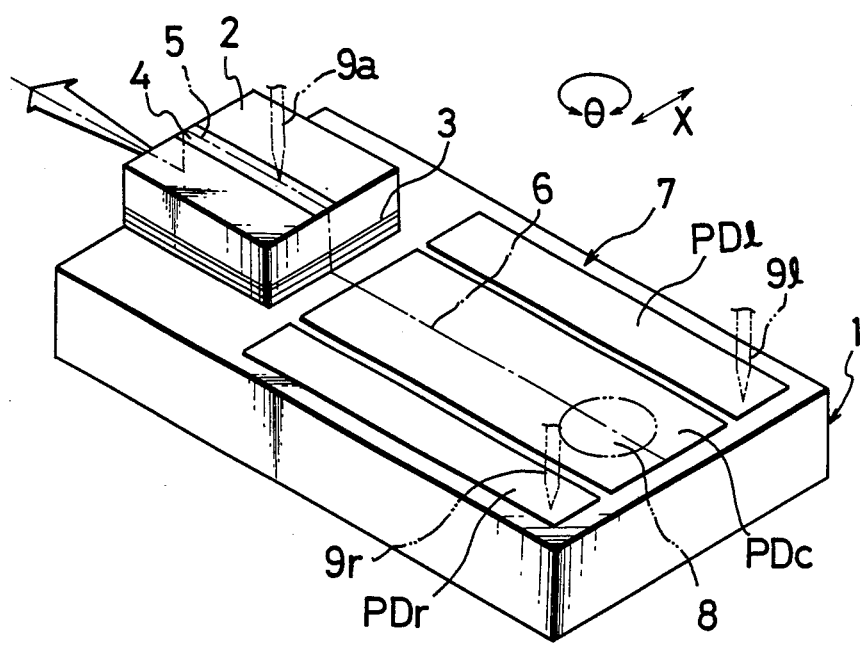
FIG. 3 is a perspective view showing a first embodiment of a semiconductor laser device according to this invention.

Referring now to FIG. 3, there is shown a semiconductor substrate 1, and a semiconductor laser chip 2 is bonded at one end portion of the semiconductor substrate 1 to the surface thereof. There is also shown an active layer 3 of the semiconductor laser chip 2 and its stripe 4. A positional relationship is established between a central line 5 of the stripe 4 and a central line 6 of the semiconductor substrate 1, such that the central lines are colinear as seen from the surface side of the semiconductor substrate 1.

On the surface portion of a monitor region 7 of the semiconductor substrate 1, there are provided three rectangularly-shaped photodiodes PDl, PDc and PDr of PIN-type with their longitudinal directions parallel to the central line 6 of the semiconductor substrate 1. When viewed from the semiconductor laser chip 3, PDl is the lefthand side photodiode, PDr is the right-hand side photodiode and PDc is the center photodiode. The longitudinal central line of the photodiode PDc is coincident with the central line 6 of the semiconductor substrate 1. The photodiodes PDl and PDr are of same size and shape and are symmetrical to the central line 6 of the semiconductor substrate 1. A wire bonding region 8 is shown on the photodiode PDc (although the wire bonding has not as yet been carried out).

The method for determining and inspecting this laser device to determine whether or not the laser chip 2 is positionally or angularly displaced in the $\theta$ direction is described hereinafter. A probe 9a is provided to contact the semiconductor laser chip 2 at its stripe 4 and a proper voltage is applied between the back surface of the semiconductor substrate 1 and the probe 9a, so that a forward drive current is supplied to a laser diode formed in the semiconductot laser chip 2. This causes an inherent laser light to be emitted from the stripe region of the active layer 3 toward the front (i.e., left-hand side of FIG. 3) as shown by an arrow. The laser light to be used for monitoring is emitted from the stripe region of the active layer 3 but toward the rear (lower right-hand side of FIG. 3).

In this situation, a probe 9l is provided and contacts the surface of the photodiode PDl, and a probe 9r is provided and contacts the surface of the right-hand side photodiode PDr. Thereafter, reverse bias voltages of the same value are applied to the photodiodes PDl and PDr. Next, the photocurrents flowing through the photodiodes PDl and PDr are detected and the detected photocurrents are compared with each other. If the difference in photocurrents is within a predetermined tolerance or range, the semiconductor laser device is symmetrical in its far field pattern and is satisfactory. If on the other hand the difference in photocurrents is beyond or outside the tolerance range, the device is not symmetrical in its far field pattern and is unsatisfactory. It will be remembered that the position of the semiconductor laser chip 2 relative to the semiconductor substrate 1 is determined such that the central line 6, with respect to which the photodiodes PDl and PDr are symmetrical, and the central line 5 of the stripe layer 4 of the semiconductor laser chip 2 are colinear as seen from the surface side of the semiconductor substrate 1. If the semiconductor laser chip 2 is positioned as described, the inherent laser light emitted from the active layer 3 of the semiconductor laser chip 2 toward the front has an ideal luminous intensity distribution in which the luminous intensity distribution in the plane direction, as shown by the arrow, is symmetrical with respect to a line extended from the central lines 5 and 6. At the same time, the luminous intensity distribution of the monitor laser light emitted from the active layer 3 toward the rear has a luminous intensity distribution which is symmetrical with respect to the central line 6. If the luminous intensity distribution of the monitor laser light beam is symmetrical with respect to the central line 6, the amount of light received by the photodiodes PDl and PDr is equal. Since the amount of light received by the photodiodes diodes PDl and PDr is detected by using the probes 9l and 9r and the light receiving amounts are compared with each other, it is possible to detect whether the semiconductor laser chip 2 is positioned correctly or not and whether or not the far field pattern of the laser light has the symmetrical property. As a result, when the semiconductor laser chip 2 is positioned with a positional displacement in the θ direction (i.e., angularly) or with a positional displacement in the X direction (i.e., the direction of the width of the semiconductor substrate 1), it can be determined that the semiconductor laser device is abnormal or unsatisfactory and it can be removed from the manufacturing process.

In this embodiment, the photodiodes PDl and PDr are used only to detect whether or not the far field pattern is symmetrical. Whereas, the central photodiode PDc is used as the monitor photodiode which automatically controls the inherent laser light after the semiconductor laser device is mounted and produced as a product.

Figure 4:
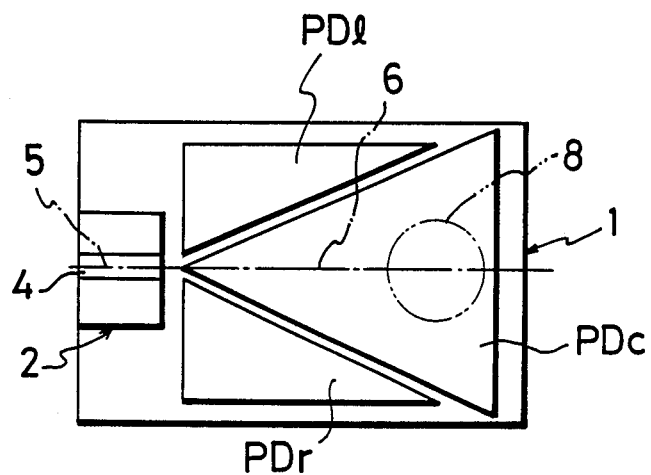
FIG. 4 is a plan view showing a second embodiment of the semiconductor laser device according to the present invention, in which the surface shape of the photodiode is modified.

FIG. 4 is a diagram showing a second embodiment of the semiconductor laser device according to this invention. In this embodiment, the photodiodes PDl, PDr and PDc are triangularly-shaped (not rectangularly-shaped) so as to increase the amount of light received by the monitor photodiode PDc which is used to automatically control the inherent laser light. In other words, the efficiency with which the laser light emitted from the semiconductor laser chip 2 to the rear is used as the monitor laser light is increased.

If the photodiodes PDl and PDr are symmetrical with each other and with respect to the central line 6, the photodiodes PDl and PDr may be formed in any shape, such as triangular, and need not always be rectangular shape.

Figure 5:
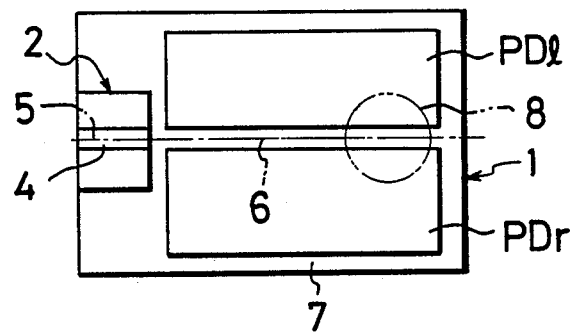
FIG. 5 is a plan view showing a third embodiment of the semiconductor laser device according to the present invention.

FIG. 5 shows a third embodiment of the semiconductor laser device, and there is provided no photodiode which corresponds to the central photodiode PDc of the devices shown in FIGS. 3 and 4. Instead, only a pair of photodiodes PDl and PDr are provided in the monitor region 7 of the semiconductor substrate 1 and these photodiodes PDl and PDr are used to detect the symmetrical property of the far field pattern and also as a monitor for the laser light to automatically control the laser light after the semiconductor laser device has been manufactured. A region 8 for wire bonding is provided and covers both the photodiodes PDl and PDr. If the semiconductor laser device is constructed as described above, substantially the entire monitor region 7 can be used as a monitor region for automatically controlling the laser light and as the monitor region for detecting whether or not the far field pattern is symmetrical. In such monitor regions, it is possible to make the detection sensitivity higher than those of the semiconductor laser devices shown in FIGS. 3 and 4.

Figure 6:
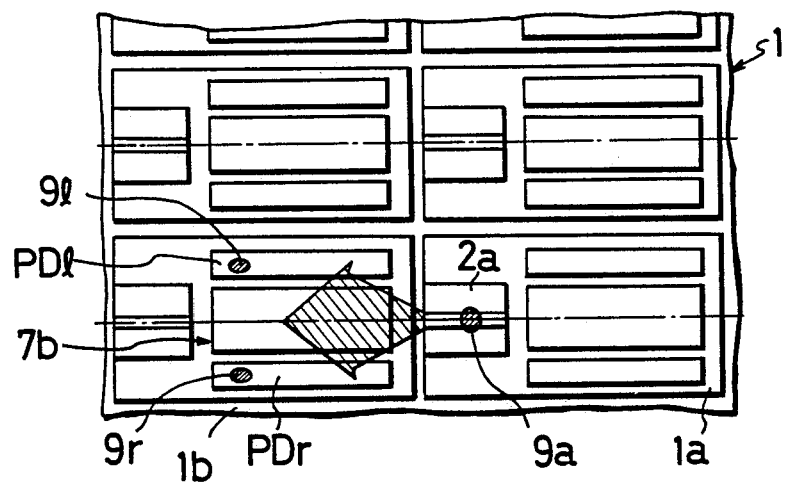
FIG. 6 is a plan view useful for explaining an example of a method for measuring an abnormality of luminous intensity distribution of the semiconductor laser device according to this invention.

FIG. 6 is a diagram showing one of the methods for measuring the symmetrical property of the far field pattern. In this measuring method, the semiconductor substrate 1 is still in the wafer state, and the inherent laser light shown by the hatched arrow from a semiconductor laser chip 2a of semiconductor laser 1a can be received by a monitor region 7b of a semiconductor laser 1b adjacent to the semiconductor laser 1a. Here the symmetrical property of the far field pattern is measured by the inherent laser light which is emitted from the semiconductor laser chip 2a to the front, not by the monitor laser light emitted from the semiconductor laser chip 2a to the rear. Thus, even when the luminous intensity distribution of the far field pattern is different as between the laser light emitted to the front and the laser light emitted to the rear, it is possible to determine precisely the symmetrical property of the far field pattern of the inherent laser light. It should be noted that the luminous intensity distribution of the far field pattern of laser light emitted to the front and rear are generally same, and if an abnormality occurs, the luminous intensity distribution will be different therebetween. In that case, the far field pattern of the monitor laser light may be symmetrical, while the far field pattern of the inherent laser light has no symmetrical property. Although such abnormality cannot be discovered by the measuring method which was described in connection with the embodiment shown in FIG. 3, it can be discovered by the measuring method just described.

Figure 7:
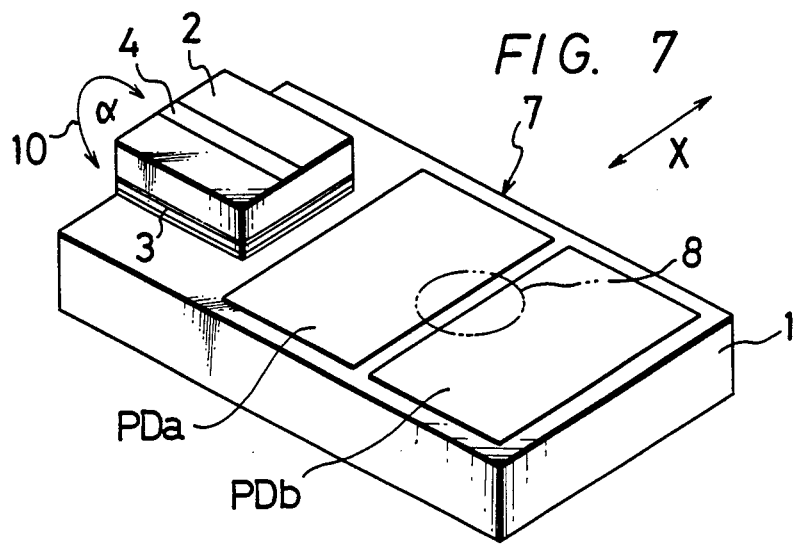
FIG. 7 is a perspective view illustrating a fourth embodiment of the semiconductor laser device according to the present invention.

Referring now to the embodiment of FIG. 7, the symmetrical property of the far field pattern in the horizontal direction is not detected, but the presence or absence of the abnormality of the semiconductor laser chip 2 in the vertical direction (the α direction shown by an arrow 10 in FIG. 7) can be detected. In FIG. 7, a photodiode PDa extends in the lateral or X direction and is provided on the monitor region 7 at its half portion adjacent the semiconductor laser chip 2. A photodiode PDb also extends in the lateral or X direction, and is provided on the monitor region 7 at its half portion away from or distal of the semiconductor laser chip 2.

By detecting whether or not the ratio between the light received by the photodiode PDa and the light received by the photodiode PDb is a predetermined value, it becomes possible to detect the presence or absence of any displacement (i.e., the presence or absence of an abnormality in the luminous intensity distribution of the laser light in the vertical direction). A wire bonding region 8 is shown which covers the two photodiodes PDa and PDb.

In such a semiconductor laser device, its normality and/or abnormality cannot be determined by a simple standard that the luminous intensity distribution is normal if the amounts of light received by the photodiodes PDa and PDb are substantially equal to each other and is abnormal if the amounts of light are largely different. The reason is that the normality of the luminous intensity distribution of the monitor laser light in the vertical direction is detected by the two photodiodes PDa and PDb, which are located on the same plane but at different distances from the semiconductor laser chip. Thus if the photodiodes PDa and PDb have the same surface area, although the luminous intensity distributions in the vertical direction are normal, the amount of light received by the two photodiodes PDa and PDb will be largely different. Accordingly, whether or not the luminous intensity distribution is normal must be determined by detecting the ratio between the two amounts of light received is a certain value or not, which value is not simply 1:1.

In this case, however, by virtue of setting the ratio of the surface areas of the two photodiodes PDa and PDb at a proper value, the normality and/or abnormality of the luminous intensity distribution can be judged by the simple standard that it is normal if the difference between the two amounts of light received is substantially zero, while it is abnormal if the difference therebetween is large.

As set forth above, according to the semiconductor laser device of this invention, the semiconductor laser chip is mounted on a surface of the semiconductor substrate at one region and a plurality of photo-detecting portions for receiving the laser light from the semiconductor laser chip are provided on the surface portion of the semiconductor substrate at another region separated from the semiconductor laser chip. Accordingly, if the semiconductor laser chip is caused to emit light, the laser light emitted from the semiconductor laser chip is electrically detected by the plurality of photo-detecting portions and the ratio between the detected amounts of the laser light by the photo-detecting portions is measured by the plurality of photo-detecting portions, whereby it is possible to measure and inspect easily the symmetrical property of the far field pattern or the displacement of the semiconductor laser chip or the like. Thus, according to the present invention, even at the stage at which the semiconductor laser device has not yet been separated from the wafer and mounted practically, the symmetrical property of the far field pattern can be easily checked and inspected. Furthermore, since the unsatisfactory semiconductor laser device is removed at that stage, it is possible to avoid the device bonding, the wire bonding, etc., from being carried out for an unsatisfactory semiconductor laser device.

From the above description of the preferred embodiments of the invention, it will be apparent that many modifications and variations could be effected by one skilled in the art without departing from the spirit or scope of the invention.

We claim as our invention:

1. A semiconductor laser device comprising:
   a semiconductor substrate;
   a semiconductor laser chip mounted on a surface of said semiconductor substrate at one region; and
   a plurality of photo-detecting portions for receiving laser light emitted from said semiconductor laser chip provided on the surface of said semiconductor substrate at another region separated from said semiconductor laser chip;
   said plurality of photo-detecting portions including first and second photo-detecting portions, each provided in regions divided by a predetermined line extending from said laser chip for receiving laser light from said laser chip.

2. A semiconductor laser device comprising:
   a semiconductor substrate:
   a semiconductor laser chip mounted on a surface of said semiconductor substrate at one region; and
   a plurality of photo-detecting portions for receiving laser light emitted from said semiconductor laser chip provided on the surface of said semiconductor substrate at another region separated from said semiconductor laser chip;
   wherein said device is elongated, said region at which said chip is mounted is adjacent one end of said device and said region at which said photo-detecting portions are provided is at the other end of said device; and
   wherein said photo-detecting portions include a central, a left and a right photo-detector portion, and photo-detecting portions are symmetrical about a first longitudinal central line extending through said central photo-detecting portion.

3. A semiconductor device as claimed in claim 2, wherein said laser chip includes a stripe and said chip and said stripe are symmetrical about a second central line and said first and second central lines are adapted to be colinear.

4. A semiconductor device as in claim 3, wherein said left and right photo-detecting portions are of substantially the same size and shape and said central photo-detecting portion is larger than said left or right photo-detecting portions.

5. A device as in claim 4, wherein said photo-detecting portions are rectangularly shaped and said central photo-detecting portion is wider than said left or right photo-detecting portion.

6. A device as in claim 5, wherein said central photo-detecting portion is provided with a wire bonding region along the first central line and remote from said chip.

7. A device as in claim 3, wherein each of said photo-detecting portions is triangularly shaped, with said left and right photo-detecting portions being of substantially the same size and mirror-image shape and the central photo-detecting portion is larger than each of the left and right photo-detecting portions and of a different shape.

8. A semiconductor laser device comprising:
   a semiconductor substrate;
   a semiconductor laser chip mounted on a surface of said semiconductor substrate at one region; and
   a plurality of photo-detecting portions for receiving laser light emitted from said semiconductor laser chip provided on the surface of said semiconductor substrate at another region separated from said semiconductor laser chip;
   wherein said device is elongated, said region at which said chip is mounted is adjacent one end of said device and said region at which said photo-detecting portions are provided is at the other end of said device, said device further includes left and right photo-detecting portions of the same size and shape, which are laterally spaced from each other and which are symmetric about a first longitudinal central line extending between said left and right portions in the space therebetween.

9. A device as in claim 8, wherein there is provided a wire bonding region which includes portions of the left and right photo-detecting portions and overlies said first center line.

10. A device as in claim 8, wherein said photo-detecting diodes are each rectangularly shaped and of the same size and shape.

11. A semiconductor laser device comprising:
    a semiconductor substrate;
    a semiconductor laser chip mounted on a surface of said semiconductor substrate at one region; and
    a plurality of photo-detecting portions for receiving laser light emitted from said semiconductor laser chip provided on the surface of said semiconductor substrate at another region separated from said semiconductor laser chip;
    wherein said device is elongated, said region at which said chip is mounted is adjacent one end of said device and said region at which said photo-detecting portions are provided is at the other end of said device; and
    wherein said photo-detecting portions include a pair of rectangularly shaped photo-detecting portions, each laterally arranged on said substrate with one photo-detecting portion adjacent the end of said substrate, the other photo-detecting portion intermediate the chip and said one photo-detecting portion and said photo-detecting portions being longitudinally spaced from each other.

12. A semiconductor laser device as in claim 11, wherein said device is provided with a wire bonding region which overlies portions of each photodiodes and the space therebetween.

* * * * *